United States Patent [19]

Early et al.

[11] Patent Number: 4,687,552
[45] Date of Patent: Aug. 18, 1987

[54] RHODIUM CAPPED GOLD IC METALLIZATION

[75] Inventors: Stephen R. Early, Beaverton; Daniel Grogan, Portland, both of Oreg.

[73] Assignee: Tektronix, Inc., Beaverton, Oreg.

[21] Appl. No.: 803,703

[22] Filed: Dec. 2, 1985

[51] Int. Cl.$^4$ ............................ C25D 5/02; C25D 5/50
[52] U.S. Cl. ........................................ 204/15; 204/37.1
[58] Field of Search ........................ 204/15, 37.1, 38.4

[56] References Cited

U.S. PATENT DOCUMENTS

| 3,699,010 | 10/1972 | Nash | 204/15 |
| 4,182,781 | 1/1980 | Hooper | 204/15 |
| 4,344,223 | 8/1982 | Bulger | 204/15 |

*Primary Examiner*—T. M. Tufariello
*Attorney, Agent, or Firm*—John Winkelman; Alexander C. Johnson, Jr.

[57] ABSTRACT

A process for two layer gold integrated circuit metallization is disclosed. The process includes electrodeposition of a first metal layer, preferably of gold, atop a barrier layer, followed by electrodeposition of a second metal layer or cap, atop the gold to form a first metallization layer. The cap is corrosion-resistant metal having a rigidity at annealing temperature greater than that of gold. Following annealing, a dielectric interlayer is deposited so as to fill the regions adjacent sidewalls of the first metallization layer. Vias are formed in the interlayer dielectric, a second barrier layer is deposited and photoresist is applied and patterned for electrodeposition of a second, gold metallization layer. During annealing, the rhodium cap retains the as-deposited shape of the gold in the first metallization layer to facilitate insulative spacing between the first and second metallizations and to insure complete filling of interlayer dielectric on the lower edges of the first metallization.

17 Claims, 4 Drawing Figures

RHODIUM CAPPED GOLD IC METALLIZATION

TECHNICAL FIELD

This invention relates to metallization of integrated circuitry and more particularly to additive metallization processes employing noble metals, such as gold.

BACKGROUND OF THE INVENTION

Additive metallization processes are distinguished from subtractive processes in that metal is selectively applied, usually by electroplating, only in the areas of the integrated circuit desired to be metallized. In subtractive processes, most commonly used with aluminum and Al-alloy metallization, the entire area of the substrate is covered, usually by bias-sputtering. Then, the desired circuit interconnect pattern is formed by subsequent removal of portions of the deposited metal. An overview of subtractive metallization is presented in an article by J. L. Vossen, "VLSI Metallization Problems and Trends" in Semiconductor International, pages 91–99, September, 1981. A further discussion of problems encountered in Al-based metallization is included in the text by S. M. Sze, entitled VLSI Technology, pages 361–372 (1983).

Additive metallization, particularly using gold but also using noble metals and copper and silver, has a number of advantages over Al-metallization in providing low-resistance integrated circuit interconnects. Most of these metals are easy to electrodeposit on integrated circuits. All but palladium and platinum provide very low sheet resistance, i.e. no more than doped aluminum. The noble metals all provide corrosion and oxidation resistance. Such metals are much more costly than aluminum. In very small-geometry integrated circuits, however, higher material cost is offset by relatively lower process cost increases than occasioned by scale reductions in Al-metallized circuits, potential for better performance characteristics, and reduced likelihood of electromigration-induced failures. Aluminum also readily oxidizes on any exposed surfaces, which can be a factor in reduction of yields of multiple metallization layer circuits.

An example and advantages of gold metallization techniques are described by D. Summers in "A Process For Two-Layer Gold IC Metallization," in Solid State Technology, pages 137–141, December, 1983. In this article the author identifies a number of problems. One is obtaining adequate dielectric coverage of the sidewalls of the metallization. In additive processes, the metal sidewalls have a slight negative or overhanging taper. This is in contrast to subtractive metallization processes, for example as shown in FIG. 12 on page 363 of VLSI Technology, which provide a positive taper. As metallization spacing is reduced and wall angle becomes more severe, sidewall coverage by line-of-sight deposition techniques is significantly reduced relative to top coverage. The inability to cover the metal sidewalls adequately with dielectric material can produce a defect or cusp extending through the dielectric to the base of the metallization. As described by D. Summers on pages 139–140, abnormal leakage currents can result.

We have discovered that the foregoing problem is worsened when a device made according to the D. Summers' process is annealed. As annealing temperatures approach the melting point of the metal, the metallization structures soften and gradually deform. In additive metallization processes, such deformation causes the metal sidewalls to bulge outward, in a bread-loaf-like overhang, increasing cusp defects. Bulging by as much as 200 nanometers (nm) has been observed. Such deformation can occur in low melting point metals, e.g., gold, silver and copper, even at a relatively low annealing temperature. Deformation can also occur with aluminum metallization but initially having a positive taper makes the problem less severe. Corrosion-resistant metals like gold are not, however, amenable to the subtractive metallization processes which yield a positive taper. Summers suggests several other possible techniques for reducing leakage, but none of them deal with breadloafing.

Accordingly, a need remains for a satisfactory additive metallization process, particularly one suitable for gold-metallization in very small-geometry, dense integrated circuits.

SUMMARY OF THE INVENTION

One object of the invention is to improve upon prior additive metallization processes.

A further object of the invention is to facilitate use of highly conductive but low melting point metals such as gold, silver and copper for IC metallization.

Another object of the invention as aforementioned is to minimize cusping.

A still further object of the invention is to minimize breadloafing in IC metallization, particularly in using low melting point, noble metals such as gold.

An additional object is to provide corrosion and oxidation-free metallization contact surfaces in multiple metallization layer circuits.

The invention provides a method for interconnecting transistors and other components of an integrated circuit using a highly conductive first metal such as gold, silver or copper. Such metals are characterized by a high $T/T_M$ characteristic, where T is the annealing temperature for the circuit and $T_M$ is the melting point of the metal and, therefore, tend to deform during annealing. Breadloafing is, nevertheless, virtually eliminated by providing a thin but stiff cap of a second conductive metal over the first metal. By "stiff" is meant that the second metal has a Young's modulus that is higher than the Young's modulus of the first metal. So that the second metal retains its shape at annealing temperature, it is selected so that the ratio $T/T_M$ for the second metal is substantially less than that of the first metal.

The first metal is preferably a corrosion-resistant metal, such as gold, but need not be, as in the case of silver and copper. In either case, it is preferable to use an oxidation and corrosion-resistant material as the conductive metal cap. An oxiation and corrosion-resistant cap is applied over silver or copper before the latter can oxidize or corrode to provide a low-impedance contact surface for a second metallization layer. The second metal need not be as highly conductive as the first metal but, if not, should be deposited in a layer much thinner than the first metal. This makes possible the use, by additive deposition or electrodeposition, of corrosible metals as the first metal, without reductions in yield due to corrosion or oxidation at contacts between first and second metallization layers. The first and second metals should also have inter-diffusivities that remain low at ordinary annealing temperatures but are sufficient to assure adhesion between the two metal layers.

In the preferred embodiment, the first metal, which provides the principal thickness of the metallization, is gold. Gold has a low sheet resistance and is corrosion-resistant. The second metal or cap is preferably provided by a thin layer of rhodium, which is also corrosion-resistant, has a very low $T/T_M$ compared to that of gold, and is much stiffer than gold. Rhodium also has a sheet resistivity which, although higher than that of gold or elemental aluminum, is comparable to that of doped aluminum.

The foregoing and other objects, features and advantages of the invention will become more readily apparent from the following detailed description, which proceeds with reference to the the accompanying drawings.

DETAILED DESCRIPTION

Figure 1:
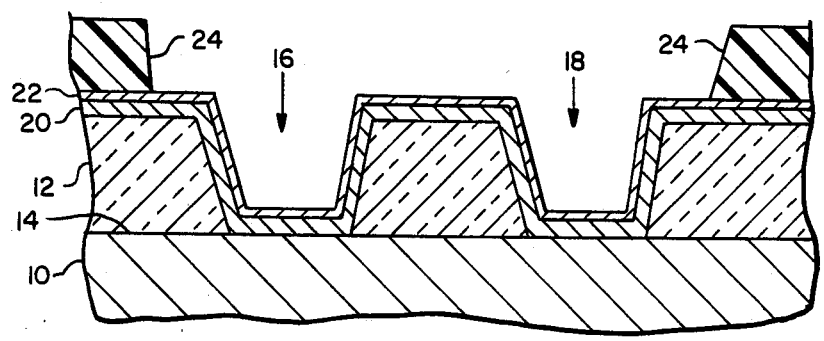
FIG. 1 is a cross-sectional view showing an intermediate stage in the process of fabrication of an integrated circuit, preparatory to metallization in accordance with the invention.

Referring to FIG. 1, preparatory to metallization in accordance with the invention, a sequence of steps to provide a first metallization layer interconnect pattern are performed substantially as described in D. Summers' article "A Process For Two-Layer Gold IC Metallization." A silicon substrate 10 is provided with an initial silicon dioxide layer 12 on substrate surface 14. The oxide layer is suitably 700 nm. thick. The dielectric layer 12 is masked and etched to form contact openings 16, 18 exposing the substrate surface 14. This procedure is followed by deposition of a first layer 20 of 125 nm. thickness of titanium tungsten (TiW) alloy and a second layer 22 of 20 nm. thickness of pure palladium. These layers are sequentially sputter-deposited on the wafer. Bias-sputtering, or ion-plating, is used to obtain substantially uniform coverage of all surfaces, including the exposed substrate surface in openings 16, 18. Layers 20, 22 provide a barrier to subsequent diffusion of gold into the silicon and provide an electrical circuit return path used in electrodeposition steps described hereinafter. Concluding the procedures leading up to FIG. 1, a positive photoresist 24 is applied and patterned to expose an area of the circuit encompassing openings 16, 18, as illustrated in FIG. 1. The wafer is now ready for metallization in accordance with the invention.

Figure 2:
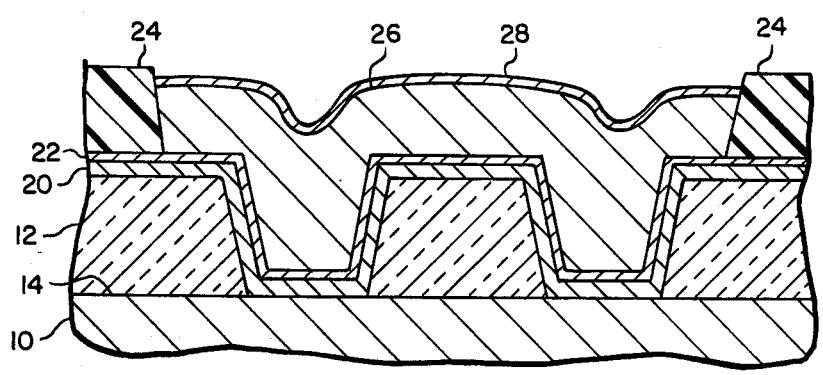
FIG. 2 shows the circuit section of FIG. 1 following two steps in the metallization process of the invention.

Referring to FIG. 2, a first metallization layer is additively deposited by sequentially electro-depositing a gold layer 26 and then a rhodium layer 28 onto the surface of palladium layer 22 exposed within the openings of photoresist 24. The wafer is first placed in a gold bath and electrolytically plated to form gold metallization layer 22 filling both of openings 16 and 18 and generally covering the opening in photo resist 24. Each wafer is placed in a recessed well of a multi-wafer holder (not shown) and held in place by spring clips that also make electrical contact with the barrier metal layers. The gold bath solution contains 9 grams per liter of potassium gold cyanide and is buffered to maintain a neutral pH. A separate power supply (not shown) for each wafer is used to maintain a current density of 2 mA/cm$^2$, providing a plating rate of about 100 nm. per minute. Gold, which has a resistivity of 2.21$\mu$ ohm-cm, is deposited in this step to a depth of about 800 nm, to provide the bulk of conductor.

A 60 nm. rhodium (resistivity=4.78$\mu$ ohm-cm) layer is then electrodeposited on the exposed upper surface of the gold metallization. The wafer is transferred to a rhodium bath containing rhodium sulfate (RhSO$_4$) in a concentration of 10 grams per liter. The bath is strongly acidic (pH=1.0). A preferred current density of 2 mA/cm$^2$ provides a plating rate of about 100 nm per minute. If the first metal is copper or silver, instead of gold, it is important to transfer the wafer to the second bath promptly, before any appreciable oxidation or corrosion can develop on the surface of the first metal.

Figure 3:
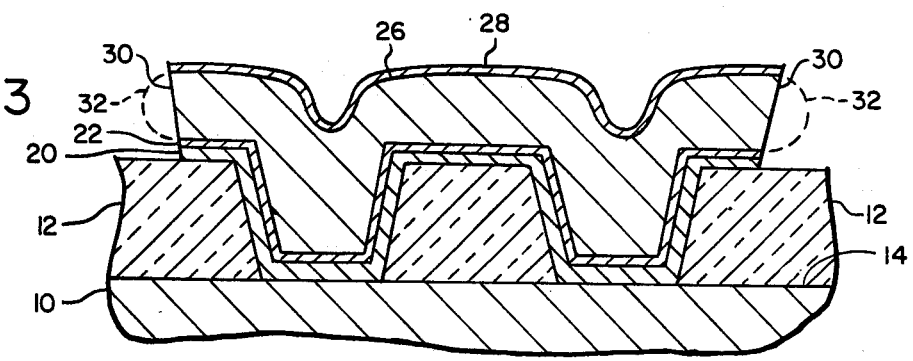
FIG. 3 shows the circuit section of FIG. 2 following mask removal and barrier metal etching steps.

Referring to FIG. 3, following the second metal deposition step, resist layer 24 is removed and the barrier metal layers 20 and 22 are etched back to the sidewalls 30 of the gold-rhodium metallization layers. Care must be taken to avoid etching the barrier layers beneath gold metallization layer 26. The palladium layer 22 is sputter etched, rather than wet etched, to avoid removing gold and undercutting the rhodium. The TiW layer 20 is etched in 30% concentrated H$_2$O$_2$.

Next, continuing to refer to FIG. 3, the circuit is annealed at 400 degrees C. for 90 minutes to relieve mechanical stresses. During annealing, the gold metallization 26 softens. In the absence of rhodium layer 28, softening is sufficient for the gold layer gradually to deform, so that the sidewalls would tend to bulge out, or breadloaf, as indicated by dashed lines 32, by as much as 200 nm. At 400° C., gold has a temperature ratio $T/T_M=0.50$, as has copper. For silver, $T/T_M=0.55$. At annealing temperature, the rhodium layer remains essentially rigid, due to its having a substantially higher melting temperature and Young's modulus than has gold. For rhodium, $T/T_M=0.30$. The greater rigidity of the rhodium layer tends to retain the original shape of the gold metallization layer, so that sidewalls 30 retain substantially their original shape. At 400° C. interdiffusion of the gold and rhodium is minimal, but sufficient to assure adhesion, about 2.0 nm. of the gold into the rhodium and non-measurable diffusion of the rhodium into the gold layer. Gold layer conductivity is essentially unaffected by diffusion due to annealing at 400°–450° C.

Platinum and most of the other platinum group metals provide structural and oxidation and corrosion-resistance characteristics similar to rhodium, although some of the others are less desirable as cap metals for other reasons. Osmium is highly poisonous; electroplating systems for iridium and ruthenium are not presently available; and palladium diffuses much more readily than desired into gold. Rhodium and platinum ($T/T_M=0.33$, resistivity=10.42$\mu$ ohm-cm) are clearly preferred as the cap metal, in the order listed.

Figure 4:
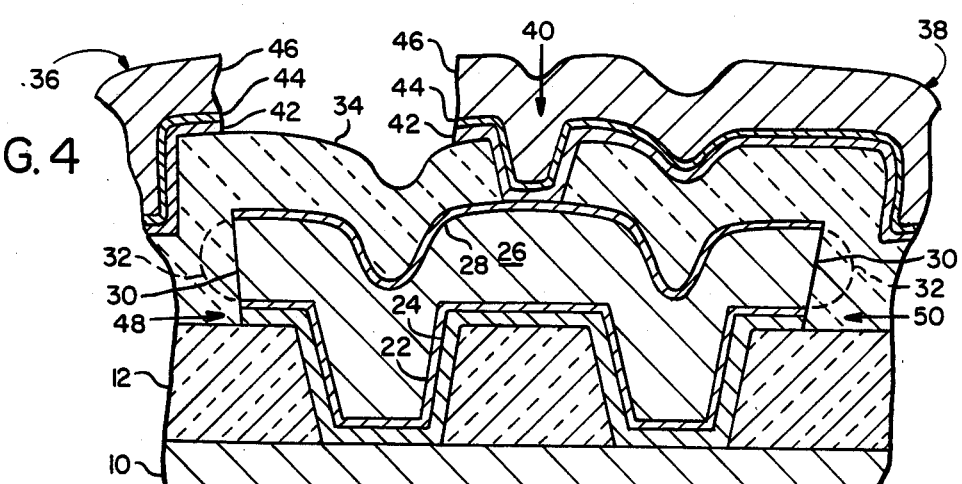
FIG. 4 shows the circuit section of FIG. 3 following application of interlayer dielectric, masking, and metallization steps to provide a second metallization layer.

Referring to FIG. 4, the next step is to apply an interlayer dielectric, preparatory to the second metallization. This is accomplished by deposition of a 700 nm. layer of silicon dioxide atop first metallization layers 26, 28, sidewalls 30 and dielectric layer 12. Various alternative forms of interlayer dielectric are described in the aforementioned article by D. Summers.

Following deposition of SiO$_2$ layer 34, the dielectric is masked with photoresist (not shown), patterned, and etched to form metallization vias 40 for electrically connecting metal lines 36, 38 of a second metallization layer to the first metallization layer. Next, the last mentioned photoresist is removed and a second set of barrier metal layers 42 (TiW) and 44 (Pd) is applied over the interlayer dielectric and into the vias. The method of deposition of the barrier metal layers and their thicknesses are as previously described for layers 20, 22. Another layer of photoresist (not shown) is applied and patterned in a manner generally similar to that shown in FIG. 1, to provide openings encompassing vias 40 and defining separate areas of second layer metallization in which metal lines 36 and 38 are next formed. Gold metallization 46 is then electro-deposited in the same manner as gold layer 26, through the openings in the photoresist onto the exposed surface areas of the barrier layers 42, 44. Then, the photoresist is removed and the exposed portions of the barrier layers 42, 44 are etched away to produce the final structure shown in FIG. 4.

If an additional metallization layer is to be provided, with an additional annealing step, a rhodium cap can be applied to the second metallization in the same manner as to the first. Otherwise, the last metallization layer is preferably not rhodium capped, so that gold wires can be readily bonded to contact pads (not shown) which are conductively connected to the metallization lines 36, 38.

The primary function of the interlayer dielectric is to provide good electrical insulation between the first and second metallizations. In the prior designs described by D. Summers, current leakage was detected between the first and second metallization layers. The leakage was attributed to the inability of the dielectric completely to fill cavities beneath the first gold metallization when the barrier metal was undercut. As mentioned above, we discovered that leakage persisted even after following the reduction techniques suggested by D. Summers, but is significantly further reduced by employing the above-described process. Specifically, referring to FIG. 4, our process retains sidewalls 30 in substantially original, or as-deposited, form through annealing, rather than permitting breadloafing as indicated by dashed lines 32. It thereby maintains a maximum of the predetermined, masked spacing between the first and second metallization materials without altering overall geometric dimensions of the metallization patterns. Moreover, minimizing breadloafing reduces geometric shadowing in the dielectric deposition step. Better dielectric filling is obtained in the corner regions 48, 50 along sidewalls 30 adjacent the edges of the first barrier layer, than when breadloafing is permitted to occur. This in turn minimizes the formation of cavities or cusps through which conduction or leakage might occur between the first metallization and second metallization layers.

Having illustrated and described the principles of our invention in a preferred embodiment thereof, it should be apparent to those skilled in the art that the invention may be modified in arrangement and detail without departing from such principles. We claim all the modifications and variations coming within the spirit and scope of the following claims.

We claim:

1. A metallization process for interconnecting elements on a integrated circuit chip, comprising:
   forming electrical contact openings in a first, surface dielectric layer on the chip;
   depositing a first metallization on the first dielectric layer in accordance with a first predetermined pattern, including into said contact openings, the first metallization having sidewalls generally normal to the first dielectric layer;
   annealing the chip at a temperature T sufficient to relieve mechanical stresses in the metallization;
   depositing a second dielectric layer on the chip to cover the first dielectric and the first metallization including the sidewalls thereof; and
   depositing a second metallization on the second dielectric in accordance with a second predetermined pattern, including a contact electrically interconnecting the second metallization and a portion of the first metallization and a conduction line at a predetermined spacing from one of the sidewalls of the first metallization;
   the step of depositing the first metallization including sequentially depositing a layer of a first metal onto the first dielectric and into the contact openings and a layer of a second metal atop the first metal and extending to edges coextensive with said sidewalls;
   the first metal being a highly conductive metal having a first rigidity characteristic and the second metal having a second rigidity characteristic, such that the second metal is more rigid than the first metal at annealing temperature T and thereby maintains the first metallization through annealing in a shape substantially as deposited.

2. A process according to claim 1 in which the rigidity characteristics of the first and second metals vary with temperature and at annealing temperature T the second metal has a $T/T_{M2}$ ratio less than the ratio $T/T_{M1}$, where $T_{M1}$ and $T_{M2}$ are the melting temperatures of the first and second metals, respectively.

3. A process according to claim 1 in which the first and second metals each have a characteristic resistivity, the resistivity of the first metal being less than that of the second metal, the depositing step including depositing each of the first and second metals to a predetermined thickness, the thickness of the layer of second metal being substantially less than the thickness of the layer of the first metal.

4. A process according to claim 3 in which the first and second metals have an interdiffusivity at annealing temperature such that they are mutually adherent but low enough at annealing temperature T that diffusion of the second metal into the first metal is limited to a small fraction of the thickness of the layer of first metal.

5. A process according to claim 1 in which the first and second metals are corrosion-resistant metals and are additively deposited.

6. A process according to claim 1 in which the first and second metals are electrodeposited.

7. A process according to claim 1 in which at least the second metal is corrosion- and oxidation-resistant, the second metal being deposited on the first metal before oxidation or corrosion of the first metal can occur.

8. A process according to claim 1 in which the sequential deposition step includes electrodepositing one of gold, silver and copper as said first metal and electrodepositing one of rhodium and platinum as the second metal.

9. A process according to claim 8, in which the first metal is silver or copper, including electrodepositing the second metal before the first metal can corrode or oxidize.

10. A process according to claim 8 in which the first metal is gold and the secod metal is rhodium.

11. A process according to claim 8 in which the first metal is electrodeposited to a first thickness; the second metal is electrodeposited to a second thickness less by an order of magnitude than the first thickness; and annealing temperature T is limited to a temperature at which diffusion of the first metal into the second metal is less by an order of magnitude than the second thickness.

12. A metallization process for interconnecting elements on a integrated circuit chip, comprising:
    forming electrical contact openings in a first, surface dielectric layer on the chip;
    depositing a first metallization on the first dielectric layer in accordance with a first predetermined pattern, including into said contact openings, the first metallization having sidewalls generally normal to the first dielectric layer;
    annealing the chip at a temperature T sufficient to relieve mechanical stresses in the metallization;
    depositing a second dielectric layer on the chip to cover the first dielectric and the first metallization including the sidewalls thereof; and
    depositing a second metallization on the second dielectric in accordance with a second predetermined pattern, including a contact electrically interconnecting the second metallization and a portion of the first metallization and a conduction line at a predetermined spacing from one of the sidewalls of the first metallization;
    the step of depositing the first metallization including sequentially depositing a layer of a first metal onto the first dielectric and into the contact openings and a layer of a second metal atop the first metal and extending to edges coextensive with said sidewalls;
    the first metal being a Group IB metal and the second metal being a corrosion- and oxidation-resistant platinum group metal;
    the sequential deposition of the first and second metals being arranged so that the second metal is deposited on the first metal in the substantial absence of oxidation and corrosion thereon, thereby providing a corrosion and oxidation free contact for the second metallization.

13. A process according to claim 12 in which the sequential deposition step includes electrodepositing one of gold, silver and copper as said first metal and electrodepositing one of rhodium and platinum as the second metal.

14. A two-layer integrated circuit metallization process comprising:
    providing a substrate having reference surface;
    forming a first dielectric layer on the reference surface;
    forming contact openings in the dielectric to expose portions of the chip surface in predetermined circuit locations;
    depositing a conductive barrier layer over the dielectric layer and the exposed portions of the chip surface;
    applying a mask over the barrier layer and patterning the mask to expose selected portions of the barrier layer including within said contact openings and adjacent thereto;
    electrodepositing a first metal layer onto the exposed portions of the conductive barrier layer, the first metal consisting essentially of a Group IB metal;
    electrodepositing a second metal layer atop the first metal layer, the second metal consisting essentially of a platinum group metal;
    removing the mask so as to expose a sidewall of the electrodeposited first and second metal layers and to expose an adjoining region of the barrier layer;
    annealing the substrate including said first and second metals, the first and second metal layers together defining a first metallization of the integrated circuit;
    selectively etching away the barrier layer in said adjoining region to expose the underlying first dielectric layer;
    depositing a second dielectric layer so as to cover the second metal, the sidewall of first metallization, and the adjoining regions of the first dielectric layer; and
    forming a second metallization on the second dielectric layer, including a via on a portion of the first metallization and a conductive line extending alongside said portion at a predetermined spacing from said sidewall.

15. A process according to claim 14, in which the first metal is silver or copper, including electrodepositing the second metal before the first metal can corrode or oxidize.

16. A process according to claim 14 in which the first metal is gold and the second metal is rhodium.

17. A process according to claim 14 in which the first metal is electrodeposited to a first thickness; the second metal is electrodeposited to a second thickness less by an order of magnitude than the first thickness; and annealing temperature is limited to a temperature at which diffusion of the second metal into the first metal is less by an order of magnitude than the second thickness.

* * * * *